United States Patent

Engeler

[15] 3,691,627

[45] Sept. 19, 1972

[54] METHOD OF FABRICATING BURIED METALLIC FILM DEVICES

[72] Inventor: William E. Engeler, Scotia, N.Y.

[73] Assignee: General Electric Company

[22] Filed: Feb. 3, 1970

[21] Appl. No.: 8,311

Related U.S. Application Data

[63] Continuation-in-part of Ser. No. 675,225, Oct. 13, 1967, abandoned.

[52] U.S. Cl. ....................................... 29/571, 29/578

[51] Int. Cl. ........................... B01j 17/00, H01g 13/00

[58] Field of Search ................ 29/571, 578, 625, 628; 148/188, 187

[56] References Cited

UNITED STATES PATENTS

| | | | |
|---|---|---|---|
| 3,350,222 | 10/1967 | Ames et al. | ..............29/625 X |
| 3,128,332 | 4/1964 | Burkig et al. | ...........29/577 IC |

*Primary Examiner*—John F. Campbell
*Assistant Examiner*—W. Tupman
*Attorney*—Richard R. Brainard, Paul A. Frank, John F. Ahern, Frank L. Neuhauser, Oscar B. Waddell and Joseph B. Forman

[57] ABSTRACT

Electrical conductors and field plates utilized in monolithic integrated circuit components are buried in insulating media by forming a high temperature resistant insulating film on the semiconductor substrate, depositing a metallic film thereover which is non-reactive with the insulator at temperatures of the order of 700° C or higher, and covering the conductive film with another high temperature resistant, non-reactive insulating film. After all fabrication steps for the integrated circuit device are completed, (which steps may optimally include diffusion into the semiconductor subsequent to deposition and encapsulation of the metallic film) contact to the metallic layer is made by etching a hole through the last deposited insulating film at one point with an etchant which is non-reactive with the metallic film, and metallizing the device in that region, making contact with the buried conductor. Such buried conductors may be utilized as conductors in printed circuit and monolithic semiconductor devices, capacitor plates, non-contacting cross-overs, and as gate electrodes in field-effect transistors, for example.

2 Claims, 6 Drawing Figures

Inventor:
William E. Engeler,
by John F. Ahern
His Attorney

Inventor:
William E. Engeler,
by John F. Ahern
His Attorney.

METHOD OF FABRICATING BURIED METALLIC FILM DEVICES

This invention is a continuation-in-part of my co-pending application Ser. No. 675,225, filed Oct. 13, 1967, now abandoned, and assigned to the present assignee.

The present invention relates to integrated circuit and monolithic semiconductor devices and the method of making the same. More particularly, the present invention relates to such devices in which one or more electrical conductors or electrically conducting plates required to be buried within an insulating medium in such devices are utilized as an integral part thereof. This application is related to the co-pending applications Ser. No. 675,228 — Brown, Engeler, Garfinkel and Gray, filed Oct. 17, 1971, now U.S. Pat. No. 3,566,517; Ser. No. 679,957 — Brown and Engeler, filed Oct. 13, 1967 now U.S. Pat. No. 3,566,518; Ser. No. 725,825 — Brown and Engeler, filed May 1, 1968, now U.S. Pat. No. 3,573,571; and Ser. No. 725,683 — Engeler, filed May 1, 1968, now U.S. Pat. No. 3,566,457 all of which are assigned to the present assignee.

In the fabrication of semiconductor devices, particularly integrated circuits and monolithic units, it is desirable that a metallic conductor be formed within and totally enclosed by a surrounding insulating medium. In the formation of such devices, it is often difficult to deposit or form a conductive element and keep the conductive element from adversely interacting with the insulating media surrounding it, to their mutual detriment. Similarly, difficulties are encountered by utilization of certain materials which must later be subjected to very high temperatures in order that diffusion and other fabrication steps in the formation of semiconductor devices are performed. At these temperatures, some metals are highly reactive and some become molten and plates and conductive strips thereof are adversely affected. Thus, for example, aluminum and gold may not withstand the temperature of formation of pyrolytically formed silicon dioxide films or of semiconductor activator impurity diffusion.

Accordingly, it is an object of the present invention to provide fabrication techniques for semiconductor devices utilizing buried electrical conductors and conducting plates wherein such devices may be formed by processing steps so as to be unaffected by subsequent high temperature semiconductor processing.

Still another object of the present invention is to provide semiconductor devices processing techniques utilizing metallic components which are non-reactive with the materials with which they are in contact.

Yet another object of the present invention is to provide improved methods of forming semiconductor devices containing self-contained totally enclosed conducting metallic films.

Another object of the present invention is to provide methods for fabricating improved integrated circuits having totally enclosed conductors therein.

Still another object of the invention is to provide a method of forming a buried protective metallic plate over active portions of semiconductor devices subject to external effects which may deleteriously affect device characteristics.

Still another object of the present invention is to provide improved monolithic semiconductor devices and methods of making the same.

Briefly, in accord with one embodiment of the present invention, I provide improved fabrication techniques for monolithic integrated-circuit, semiconductive devices and components therefor, wherein a semiconductive substrate is first coated with a first insulating layer, and a thin metallic film of a material such as molybdenum or tungsten or an alloy thereof, for example, which is non-reactive with insulators utilized in semiconductive devices, and which may withstand high temperatures without degradation, is formed over the insulating layer. The metallic film is patterned to any desirable shape and form to provide one or more patterned film portions by conventional photoresist and etching techniques and a second insulating layer is deposited over the entire device surface covering the patterned metallic film portion to fully enclose the same. Immediately thereafter, or after subsequent heating, diffusion, alloying, insulating film formation or other semiconductor fabrication steps, contact is made to the buried metallic film portion by etching through the covering insulating layer with an etchant which dissolves the material covering the patterned metallic film portion but which does not attack the metallic film. Contact is then made to the metallic film portion through one or more holes etched in the surrounding insulator.

The novel features believed characteristic of the present invention are set forth in the appended claims. The invention itself, together with further objects and advantages thereof, may best be understood with reference to the following detailed description, taken in connection with the appended drawing in which, FIG. 1 is a flow chart describing the formation of a simple buried metallic conductor in accord with the present invention;

FIG. **2*a–g* is a series of illustrations of a semiconductor device in the process of fabrication, corresponding to the various steps of the flow diagram of FIG. 1**;

Figure 1:
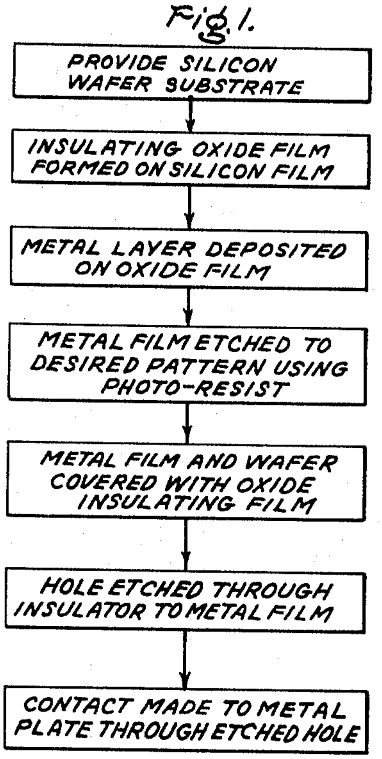

In FIG. 1, a flow chart representing the simplest mode of fabrication of semiconductor devices in accord with the present invention is illustrated. While the invention may be practiced in the fabrication of monolithic integrated circuitry and the like utilizing germanium, silicon, gallium arsenide, or any other desirable semiconductive material as the substrate, for purposes of simplicity and ease in description, the invention will be described herein with respect to the formation of semiconductor devices and circuits utilizing a silicon chip or wafer as the substrate. As used herein, the term monolithic circuit element or module is meant to connote a device or module in which a single substrate has formed therein and thereon active and/or passive elements solely by the use of semiconductor device fabrication steps conducted at temperatures in excess of 700° C, except for final contact making steps, and specifically excludes thin film, thick film and hybrid techniques wherein low temperature components and processes (other than final contacts) are utilized.

The process illustrated in FIG. 1 is started utilizing, for example, a silicon chip or wafer which may, for example, be one inch in diameter and 0.010 inches thick. The silicon wafer has a pair of major surfaces which are monocrystalline and preferably have a major crystallographic orientation desirable for the formation of semiconductor devices, as for example, parallel with the (1, 1, 1) plane. The one major surface is polished to optical smoothness as an initial step. A thin layer of an insulator which is sufficient to electrically insulate the silicon substrate from future conductors deposited thereupon and which, conveniently, has the characteristic of protecting the surface of the silicon against surface leakage or the creation of surface states which may cause degradation thereof, is formed upon the one major surface of the silicon substrate. Such a layer may conveniently be one or more films in any order or number of materials such as silicon oxide, silicon nitride, or an amorphous combination of silicon, oxygen, and nitrogen such as is disclosed in co-pending application of F. K. Heumann, application Ser. No. 598,305, filed Dec. 1, 1966, now abandoned and assigned to the present assignee. This material is generally referred to as silicon oxynitride. For simplicity of explanation, it will be assumed that a silicon dioxide film 11 is formed upon a major surface of silicon wafer 10. Such a film may be 1,000 A. U. thick and may be formed by heating the silicon substrate for approximately 1 hour in a dry oxygen atmosphere at a temperature of approximately 1,100° to 1,200° C. Such conditions form a dense, uniform, thermally-grown layer of silicon dioxide which serves as an insulating and passivating agent for the silicon. In accord with the present invention, a layer of a metal which is non-reactive with silicon dioxide (or with silicon nitride or with silicon oxynitride if the same utilized as the insulating and passivating layer), as for example, molybdenum or tungsten, or high temperature, non-reactive alloys thereof, is formed upon the silicon dioxide layer 11 upon silicon wafer 10. After the formation of a molybdenum film, for example, of, for example, a thickness of 1,000 A. U. to 5,000 A. U. by vacuum evaporation or sputtering upon a substrate heated to approximately 400° to 500° C, for example, in an atmosphere of, for example, 5 micron pressure of an inert gas, as for example, argon, the metal film is patterned in the shape and dimension desired in accord with the use to which it is to be placed. The deposition and and utilization of a molybdenum film upon a silicon dioxide film is also disclosed and is claimed in the co-pending application of Tiemann et al., Ser. No. 606,242, filed Dec. 30, 1966, and assigned to the present assignee, the disclosure of which is incorporated herein by reference thereto.

Patterning of the molybdenum layer on top of the passivating and insulating oxide may be performed by a photochemical and etching process utilizing a photoresist compound, many of which are available and are well-known to the art. One such material is sold under the trade name KPR by Eastman Kodak Company of Rochester, N.Y., and is described in an Eastman Kodak Company publication entitled, "Photosensitive Resists for Industry," published in 1962. Patterning, utilizing the photoresist, is done by spreading a layer of photoresist material over the entire surface of the exposed molybdenum film and exposing the photoresist through a masking pattern to an appropriate wavelength U. V. light, suitable to cause a chemical reaction to occur within the exposed portions of the photoresist material.

Generally, those portions of the metallic film which are desired to be retained are exposed to the fixing radiation of the photoresist covering those portions. The photoresist coated wafer is immersed in a developer, furnished by Eastman Kodak Company, for example, and known as Photoresist Developer. This developer causes the unirradiated portion of the photoresist material to be washed away while causing the irradiated portions to form a gel which is resistant to removal and, after washing in the developer, remains in place.

After developing, the pattern of photoresist upon the surface of the coated wafer is essentially the pattern which is desired to be formed in the metallic molybdenum coating. Following developing of the photoresist, the wafer is washed in distilled water and subjected to an etch bath, to remove the metallic tungsten or molybdenum for example, surface at the exposed portions thereof. A ferricyanide etch, for example, etches away tungsten and molybdenum, the latter at a rate of approximately 9,000 A. U. per minute. Thus, a 1,000 A. U. thick layer of molybdenum need be immersed for only 1/9 minute therein, whereas a 5,000 A. U. thick molybdenum fill would require that the wafer be immersed in a ferricyanide etch bath containing, for example, 92 grams $K_3Fe(CN)_6$, 20 grams KOH, 300 grams $H_2O$; for approximately one-half minute. Other etchants may be used. For example, as set forth in the aforementioned Eastern Kodak book, an acid etch containing one volume concentrated $H_2SO_4$, one volume $HnO_3$ and three volumes $H_2O$ or the phosphoric acid etchant used to etch aluminum, as described hereinafter, may be used to etch molybdenum. Another suitable etchant for tungsten has the constituents $92gNHFe_2(CN)_6$, $40gNH_3(OH)$, $300gH_2O$. Other suitable etchants may be found in the metallurgical literature.

After removal of all of the molybdenum that is not covered by the developed photoresist, the wafer is washed in distilled water and is then scrubbed with trichloroethylene or any other suitable photoresist stripper, such as hot concentration $H_2SO_4$ or known resist strippers.

After removal of the photoresist, the entire wafer is then subjected to a process for coating the same with a thin film 13 of approximately 1,000 to 5,000 A. U. of an insulator which may be high temperature formed silicon dioxide, silicon nitride, or silicon oxynitride. Such films may be formed by known pyrolysis techniques and are generally performed at substrate temperatures of approximately 800° C, or higher. It is, therefore, essential that the molybdenum or other metal utilized be mechanically and chemically stable and non-reactive with the insulating film at such temperatures. For a more detailed description of specific details of such deposition steps with these materials, reference may be had to the aforementioned Heumann application, Ser. No. 598,305, filed Dec. 1, 1966. More specifically, an amorphous coating containing approximately 35 percent $N_2$, 60 percent Si and 50 percent $O_2$ (by weight) may be formed upon a silicon wafer heated to 800° C to 1,200° C in an atmosphere of silane, ammonia, and oxygen by a thermal description and pyrolytic deposition process. Similarly, as is described in the aforementioned co-pending application of Brown et al., Ser. No. 675,228, filed Oct. 13, 1967, a film of silicon nitride may be formed upon a silicon wafer by the pyrolysis of $SiH_4$ and $NH_3$ at a surface temperature of approximately 1,000° C. As is disclosed in the same Brown et al. application, a film of silicon dioxide may be formed upon a silicon surface heated to a temperature of approximately 800° C by the pyrolysis of ethyl orthosilicate thereon. In general, the same insulator as is initially utilized to coat the silicon substrate is used as the second insulating layer, although this is not necessary. On the other hand, if a capacitor is to be formed between a pair of spaced parallel plates formed in accord with the present invention, the film deposited immediately over the patterned metallic film may be a material which is chosen to have the appropriate dielectric constant and breakdown strength, in addition to high temperature resistant characteristics.

Figure 2:
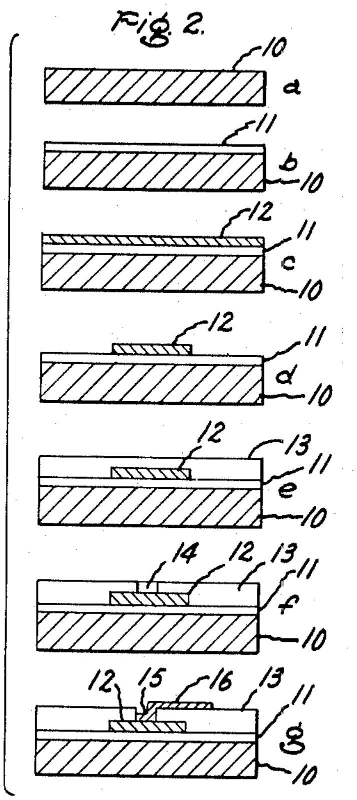

Many such materials being well-known to those skilled in the art. One such material having excellent high-field breakdown strength is high temperature, as for example, pyrolytically formed, silicon dioxide. The oxide-coated silicon wafer is represented in FIG. 2*b* of the drawing. The metallic film coated wafer is shown in FIG. 2*c*, the etched metallic film-covered wafer is shown in FIG. 2*d*, and the insulated-coated wafer is shown in FIG. 2*e*. In all the aforementioned illustrations, it should be understood that the representation of film thickness is greatly disproportionate, since these films are of the order of 1,000 to 5,000 A. U., which is an insignificant fraction of the thickness of wafer 10, and if represented in true proportion would be invisible. Accordingly, the thickness as illustrated in FIG. 2 and other figures of the drawing is greatly disproportionate.

After the formation of the insulating film 13 over and enclosing metallic film portion 12, which has been patterned to the desired shape and size, a number of modifications may result in a number of different embodiments of devices in accord with the invention. In the simplest, the illustrations of FIGS. 1 and 2 will be continued to show the formation of a single buried conductive strip, as for example, a connecting conductor between integrated circuit components in a monolithic semiconductor integrated circuit.

Instead of making contact to the two ends of conducting member 12 at this point, if an integrated circuit is fabricated, as is conventional, further device processing steps such as high temperature insulator deposition (in excess of 700° C or diffusion (approximately 900° C to 1,300° C) may be carried out and the making of contact to the buried conducting film made after such steps. When these steps are concluded, a metallizing step may be used to make point-to-point contact between conductors.

In accord with the next step of the basic process, the conductor is already buried and it remains only to make electrical contact thereto. To accomplish this, the entire wafer is covered with a suitable photoresist, as for example, KMER or KPR, which is irradiated with U.V. to provide for a suitable etch mask, in this instance, covering all but portions over patterned metallic film portion 12 or other active circuit elements which are to be the contact area, or which is to interconnect two or more electrical conductors or different regions of active or inactive circuit element, and after removing of the mask through which the photoresist is irradiated and developing of the photoresist, the wafer is washed with a suitable etchant for the insulating film, as for example, buffered HF (1 part concentrated HF solution, plus 10 parts by volume, 40 percent $NH_4F$ solution) in the case of silicon dioxide. Concentrated HF may be used to etch silicon nitride or silicon oxynitride. Due to the fact that the molybdenum film is resistant to etchants normally used to etch such insulating layers, it serves as an "etch-stop" and thereby protects the underlying insulating film from attack by this etching step. Another means for insuring the integrity of the pattern on the silicon, particularly in the case of the use of strong etchants for silicon nitride, is to provide a metallic transfer layer of, for example, molybdenum, as is described in greater detail in the aforementioned application of Tiemann et al., Ser. No. 606,242. Such a layer also provides protection for underlying insulating layers during etching. After the removal of the photoresist, the remaining wafer having a major surface comprising in part insulating coating 13 with an aperture 14 therein through which metallic film 12 is visible, and which is illustrated in FIG. 2*f*, is then subjected to a metallizing step.

In accord with the metallizing step, a suitable metal, which need not satisfy the high temperature resistant criteria which film 12 must satisfy, as for example, aluminum, may be vacuum evaporated or sputtered in an inert atmosphere, as for example, argon, to form a metallic coating over the entire surface of oxide film 13 and filling aperture 13 making contact with film 12. Subsequent to this metallizing step, the photoresist and etching technique may again be utilized to form an etch mask over the aluminum so as to make it possible to remove, by appropriate etching, as for example, with an etchant consisting of 76 volumetric percent of orthophosphoric acid, 6 volume percent of glacial acetic acid, 3 volume percent of nitric acid and 15 volume percent of water; as mentioned hereinbefore, this etchant is also useful in etching other metals such as molybdenum. The etched contact material 15 which remains, fills aperture 14 in insulating layer 13 and leaves a slight protuberance 16 on the surface of film 13 to which electrical contact may extend to other electrical conductors or to the active or inactive circuit elements, as discussed above, or may be contacted by additional plating means or by conventional contact means, assuming that this contact is to be made a terminal of an integrated circuit.

At this point, a great advantage over devices and processes of the prior art of integrated circuitry becomes apparent. In accord with prior techniques, all active device formation had to be completed prior to forming circuit interconnections because conventional contact making techniques and materials resulted in contact members which could not withstand the temperature necessary for device formation, (i.e., diffusion), without adverse effects upon the contact materials and the insulators adjacent thereto.

In accord with the present invention, these limitations are removed. Thus, provision for electrical contact between parts of the same device, or between different devices may be made prior to or during device fabrication because buried conducting members made in accord with the present invention are able to withstand device fabrication temperatures without any adverse effects to the contact members or the adjacent materials.

In accord with this embodiment of the invention, a plurality of contact members which are utilized to make electrical connections to various regions of a semiconductor wafer, upon which a monolithic integrated circuit stage is constructed, may be fabricated in series without making actual contact between the individual films until it is desired. Naturally, if contact is to be made between a pair of intersecting films, contact must be made before the last deposited film is covered. On the other hand, it may not be necessary to contact a particular conductor until all films have been deposited. This is greatly advantageous, in that the metallic contact or connection resulting from the buried metallic film need not be exposed to ambient air and will be greatly protected from corrosion and reacting with etchants during semiconductor device fabrication, it being necessary to make contact thereto only after the device is fabricated. It is then only necessary to etch through the insulating layers with a suitable etchant which may be buffered HF (1 part HF and ten parts ammonium fluoride) in the case of silicon dioxide and silicon oxynitride; 85 percent phosphoric acid in the case of silicon nitride; or hydrofluoric acid for silicon nitride (when no $SiO_2$ is present or if present, is adequately protected by an etch stop or transfer layer).

Figures 3, 4:
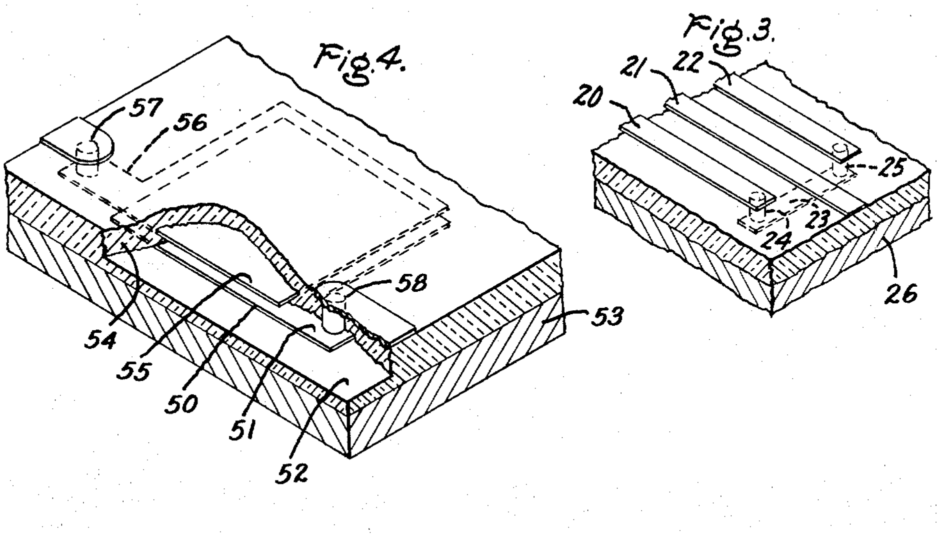
FIG. 3 is a perspective view with parts broken away of a conductive crossover in an integrated circuit component constructed in accord with the present invention.
FIG. 4 is a perspective view, with parts broken away, of an integrated circuit capacitor formed in accord with the present invention.

In FIG. 3, there is illustrated a portion of an integrated circuit wherein a plurality of conductors 20, 21, and 22 are laid down serially with an interconnecting metallic film portion 23, which serves as a non-contacting cross-over, connected between members 20 and 22 at terminal connections 24 and 25, all of which are insulated from substrate 33. Terminal connections 24 and 25 are formed, as in the last step of the flow diagram of FIG. 1 and illustrated in FIG. 2*g*. In FIG. 3, film member 23 is separated from film member 21 and 22 by a thin insulating film.

A capacitor which may be a part of a monolithic integrated circuit may be formed in accord with the present invention, a resultant structure being illustrated in FIG. 4 of the drawing. In FIG. 4, a first metallic film, as for example, molybdenum film 50 having a contact tab 51 is deposited, after formation of an insulating layer 54, upon a silicon semiconductor substrate 53, and is patterned as in the description of FIGS. 1 and 2 to have a rectangular configuration. Thereafter, a second insulating layer 54, having the desired dielectric constant, is deposited thereover, burying patterned film 50, and a second conducting film, as for example, molybdenum film 55 is deposited thereupon and patterned in the same general shape and size as is first plate 50. A second conducting tab 56 located so as to be non-overlapping with respect to tab 51, is a part of the pattern of film 55. After a third insulating layer is overlaid over and burying patterned film 55, a contact 57 is made to tab 56 and a contact 58 is made to tab 51, as described with respect to FIG. 1 and illustrated in FIG. 2*g*, to form a completely buried enclosed, but readily contactable semiconductor monolithic integrated circuit capacitor. As is mentioned hereinbefore, the dielectric of this capacitor may be chosen to suit the desired need as may the thickness dimension thereof may be varied for the same purposes.

The capacitor of FIG. 4 is representative of numerous devices and circuit components which may be constructed in accord with the invention. Thus, for example, by varying the size, geometrical configuration, and number of the juxtaposed and insulated conductors, as well as the dielectric characteristics of the interposed insulator or insulators, such devices as high frequency transmission lines for carrying electronic information-containing signals may be formed. Three such completely enclosed and insulated conductors may constitute a transmission line whose characteristic impedance is determined by a capacity per unit length between the central conductor and the outer conductors, which may serve as ground-planes, and the inductance per unit length of the central conductor.

Figure 5:
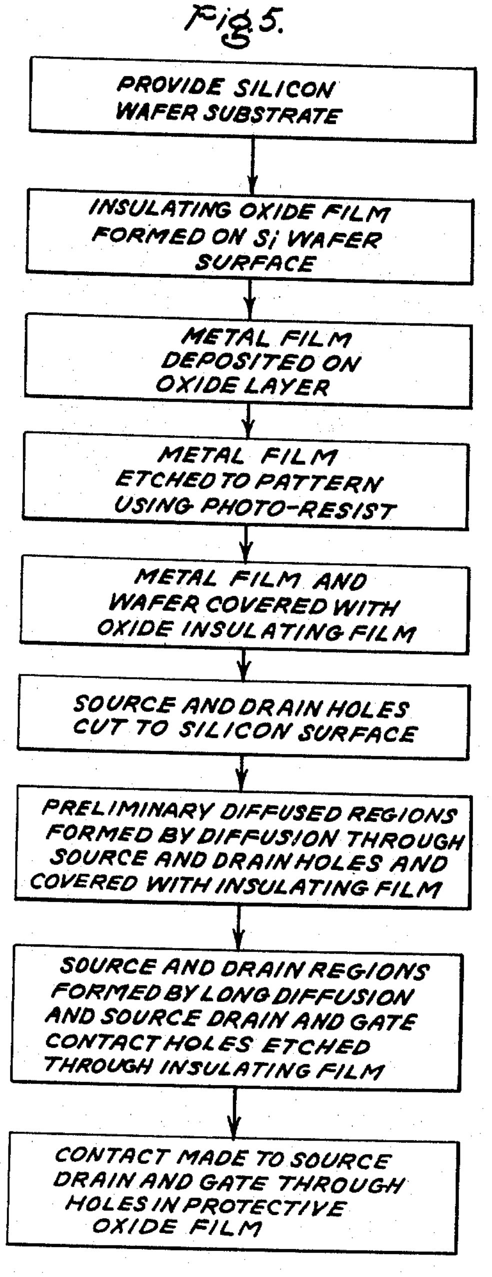
FIG. 5 is a flow diagram illustrating the steps in the fabrication of a field-effect transistor utilizing a buried-gate electrode formed in accord with the present invention.

In FIG. 5 of the drawing, a flow diagram describing the formation of a depletion mode field-effect transistor embodying the present invention is illustrated. Concurrently, FIG. 6*a–h* illustrates schematically the cross-sectional configuration of a silicon wafer upon which the field-effect transistor is fabricated in accord with the process steps of FIG. 5.

Formation of a plurality of similar field-effect transistors on a single wafer is started with the selection and major surface preparation of an appropriate monocrystalline wafer 30 of silicon which may, for example, be 1 inch in diameter and 1.014 inches thick. Wafer 30 is doped to have the desired conductivity characteristic as, for example, with approximately $10^{15}$ atom per cc phosphorus or boron to secure N-type or P-type conductivity, respectively. Upon wafer 30, an insulating layer 31 is formed. As with the insulating layer of FIG. 2, this insulating layer may be silicon dioxide which may conveniently be formed thermally by heating in an atmosphere of dry oxygen for approximately one hour at a temperature of 1,100°–1,200° C, or a layer of silicon nitride or silicon oxynitride of approximately 1,000 A. U. thickness may be deposited thereupon by the pyrolytic reaction between silane, ammonia, and oxygen upon a silicon substrate heated to approximately 1,100° C, as is disclosed in the aforementioned Heumann application. Alternatively, any desired combination of the above may be used. For example, a 1,000 A. U. layer of thermally grown $SiO_2$ may be covered with a 1,000 A. U. film of pyrolytically formed $Si_3N_4$.

After a suitable insulating layer 31 has been formed, a thin metallic layer 32 of a metal, such as molybdenum or tungsten, or an alloy thereof, which is non-reactive with silicon dioxide, silicon nitride, and silicon oxynitride at the temperatures of the order of 1,000°–1 ,500° C; which is unaffected by etchants conventionally utilized to pattern these materials (etchants usually containing hydrofluoric acids); although there are many such etchants well-known to those skilled in the art, is deposited as is illustrated in FIG. 5*c*. To form a field-effect transistor, the molybdenum film 32 is patterned using photoresist and etching techniques as is described hereinbefore, so as to leave at least a gate electrode which may, for example, have a dimension of 50 microns. After the patterning of gate electrode 33, a second insulating-passivating film 34 is deposited thereupon, as is described hereinbefore, and as illustrated in FIG. 6*e* of the drawing. In future processing of the semiconducting device in accord with the present invention, the molybdenum film encased in insulating-passivating layers 31 and 34, is unaffected thereby and does not react therewith so as to deleteriously affect their insulating and passivating characteristics.

Figure 6:
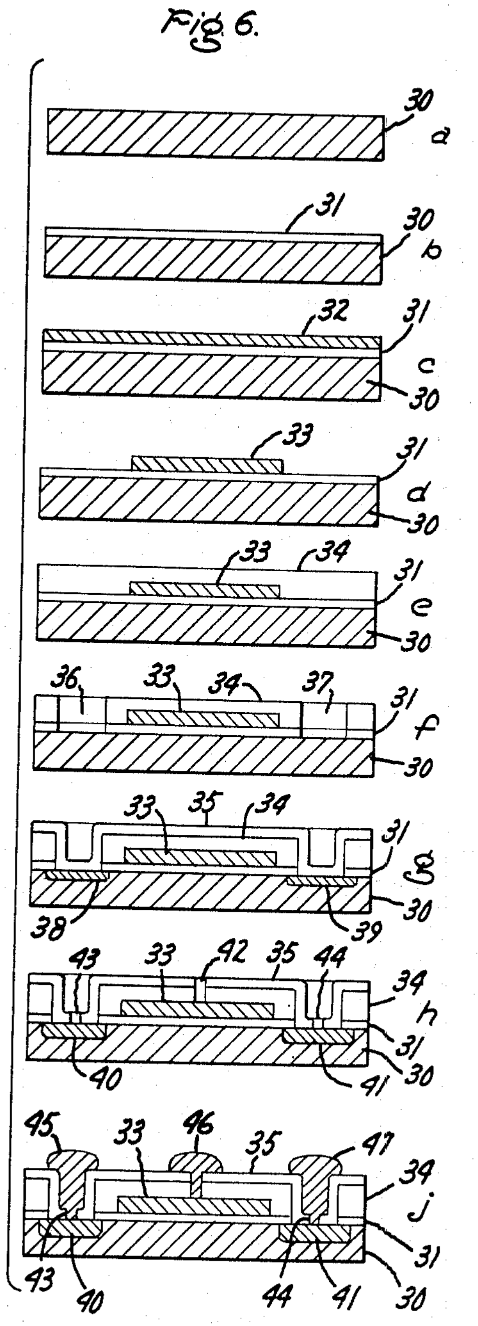
FIG. 6 is a series of illustrations of a semiconductor field-effect transistor in the various stages of fabrication, corresponding to the steps of FIG. 5.

The next step in this embodiment, the formation of the field-effect transistor is to etch holes in layers 31 and 34 to provide for source and drain regions of the field-effect transistor. This may conveniently be done by applying a layer of photoresist over the entire surface of insulating film 34 and utilizing a suitable mask to irradiate all of the photoresist except regions 36 and 37 which are to be the source and drain. As illustrated in FIG. 6, the device does not have radial symmetry but is rather illustrated as a device having longitudinal symmetry. Accordingly, regions 36 and 37 are not portions of an annulus but are descrete regions. After the photoresist has been developed over all but regions 36 and 37, at which the unexposed photoresist is removed, the oxide, nitride or oxynitride layers thereunder are etched away, as before, exposing the silicon substrate. To remove silicon dioxide or silicon oxynitride, a buffered HF etchant, described hereinbefore, may be utilized, whereas if silicon nitride is used, an etchant comprising approximately 85 weight percent $H_3PO_4$ (remainder water) used at approximately 180° C, or a concentrated HF etchant may be utilized for this purpose. The wafer, after regions 36 and 37 of film 34 have been etched away, is illustrated in FIG. 6*f*. After the etching of regions 36 and 37, the wafer is washed in distilled water and a suitable activator impurity is diffused through apertures 36 and 37 to cause the surface adjacent regions of substrate 30 to have the conductivity characteristics thereof modified. Thus, for example, if region 30 originally possesses N-type conductivity characteristics, a pair of P-type surface-adjacent, conductivity-modified regions 38 and 39 may be created therein by diffusion of boron through regions 36 and 37 of oxide film 34. For example, boron may be diffused, either from a gaseous atmosphere, with the wafer at a temperature of 1,100° C and a flow of gas passing continuously over the wafer or from a doped glass. The flow comprises, for example, 1,900 cc per minute of $N_2$, 1,800 cc per minute of a mixture of 0.25 volume percent of B $Cl_3$, in nitrogen, 1 cc per minute of oxygen and 0.5 cc per minute $H_2$, for a period of approximately 0.5 hour. During this process, boron diffuses into the surface of the silicon and forms small diffused regions 38 and 39. A light etch of, for example, 15 seconds removes any boron glass formed on film 34. The entire wafer is then covered with a protective film 35 of about 2,000 A. U. thick of $SiO_2$ or $Si_3N_4$ or silicon oxynitride.

Alternatively, if the wafer 30 possesses P-type conductivity characteristics, N-type conducitivity modified source and drain regions 38 and 39 may be formed by heating the wafer for approximately one-half hour to a temperature of approximately 1,000° C, for example, in a reaction vessel containing a quality $P_2O_5$ which, at this temperature, volatilizes and reacts with the wafer to form regions 38 and 39, heavily doped with phosphorus, and reacts with the $SiO_2$ of film 34 to form a region of phosphorus-rich glass. This glass may be removed along with excess $P_2O_5$ on the surface of the silicon by etching the wafer in an etchant comprising 15 cc concentrated HF, 10 cc concentrated $HNO_3$, and 300 cc $H_2O$ for about 15 seconds and rinsing in distilled $H_2O$. As in the boron diffusion example, the first-diffused wafer is covered with an insulating film 35, and the wafer is baked at approximately 1,100° C for approximately either 4 or 16 hours in an inert atmosphere, as for example, argon, to form regions 40 and 41 for the dimensions given hereinbefore.

Alternatively, as is disclosed in the aforementioned cross-referenced application Ser. No. 679,957, Brown et al., concurrently filed with my application, Ser. No. 675,225, now abandoned, of which this application is a continuation-in-part, passivating film 31 need not be etched at these regions, the patterned metallic film rather than the oxide serves as a diffusion mask for source and drain regions and diffusion occurs through the gate oxide, as is well-known, this will require an increased diffusion time or temperature. Alternatively, as is more fully disclosed therein, the silicon dioxide film formed over the patterned metallic film portions may be formed by pyrolysis of ethyl orthosilicate containing approximately 10 volumetric percent, for example, of an activator containing gas such as tri-ethyl borate or tri-ethyl phosphate to form a boron or phosphorus doped glass, for example. Diffusion may then be for approximately 4 hours at 1,100° C, for example, and the second deposited film serves a dual purpose, namely, as a source of dopant and as a part of encapsulation of the gate.

The wafer is heated at a temperature of approximately 1,100° C, for example, for a sufficient time to diffuse the previously-diffused boron in regions 38 and 39 outwardly, so as to extend beneath the central portion of molybdenum film 33. For a device in which the edge of aperture 36 extends 0.0,001 inch over the edge of molybdenum film 33, approximately 4 hours time is sufficient. An overlap distance of 0.0,002 inches requires 16 hours. The time required increases as the square of the overlap distance. By this step, source and drain regions 40 and 41 are formed to a depth of approximately 0.0,002 inches. Higher temperatures for shorter diffusion times may also be used, as may lower ones for longer times.

Subsequent to the formation of surface-adjacent regions 40 and 41 in substrate 30, photoresist and etching techniques are again utilized to etch a hole to the molybdenum film utilizing a suitable etchant, for example, concentrated HF, to form a hole 42 in film 34, exposing a portion of molybdenum film 33. Similarly, holes 43 and 44 are etched in film 35 to expose a portion of source and drain regions 40 and 41. Subsequent thereto, the entire surface of the wafer may be metallized, as for example, by vacuum evaporation, and suitable etching and masking techniques, utilizing photoresists, are used to form a pattern on the metallic coating so that upon removal of portions thereof, only electrical contacts 45 to source region 40, 46 to gate 33, and 47 to drain region 41 remain. It will be appreciated that the illustrations herein are schematic, in order to illustrate most succinctly the concepts involved. In a commercial device, the electrical characteristics are controlled by controlling the channel length, i.e., the distance between source and drain regions 40 and 41 in FIG. 6*j*, often this dimension is so small that contact 46 may not, as a practical matter, be made to the superposed portion of the gate, but is made to an adjacent enlarged extension thereof (not shown). This extension is conveniently made over a thick oxide region to minimize gate-substrate capacitance. Gates of few microns in the small dimension (channel length) and as large as 50 microns in the larger dimension may have a generally circular contact area adjacent and of a diameter of approximately 15 to 20 microns.

In the foregoing description, for sake of brevity and clarity of expression, the diffusion temperatures expressed have been those utilized with respect to silicon diffusion by boron and phosphorus, for example. In general, these temperatures are of the order of 900°–1,300° C. It will be appreciated, however, that the exact temperature of diffusion may vary somewhat depending upon the specific semiconductor material, and the specific dopant utilized. These variations, however, are well-known to those skilled in the art and may be found, for example, in the following texts:

1. "Diffusion in Solids," by P. G. Shewmon, McGraw Hill Company, New York, 1963.
2. "Silicon Semiconductor Technology," by Runyon, McGraw Hill Company, New York, 1965.

Thus, in order to encompass these variations in describing diffusion temperatures to which insulators and metallic layers in accord with the invention must be resistant, the phrase, "semiconductor diffusion temperatures," is herein utilized.

In the operation of an enhancement mode FET, conductivity between source and drain regions 40 and 41 respectively, is through a thin P or N-type channel formed by application of an appropriate polarity voltage to the gate electrode. As a practical matter, it is desired that the channel length from source to drain regions be as short as possible, and of substantial width. The gate is, therefore, somewhat wider than the length of the channel and somewhat longer than its width. Due to these geometric limitations of the foregoing, "landing pads" are normally provided and are regions of enlarged dimensions adjacent the active portion of the gate to form electric contact means. The drawing, being schematic, does not show this.

The foregoing description relates to enhancement mode FET devices wherein the channel between source and drain is created by the application of voltage to the gate. A similar device, a depletion mode FET, wherein an existing channel is modulated by depletion of the charge therein, may be formed in accord with the present invention without the necessity of requiring the source and drain regions to extend under the gate electrode.

In accord with the foregoing, I have disclosed in several embodiments, the formation of varied metallic conducting films of etch-resistant, non-reactive metals such as molybdenum and tungsten, and their non-reactive, high temperature alloys, buried within oxide, nitride or oxynitride films of silicon semiconductor devices, for example, for the formation of monolithic integrated circuits and components which greatly facilitate construction of such devices and the ready access to such contacts at any time in the fabrication process desired. Of great advantage, in this respect, is the adaptability of the invention for the provision of buried metallic conducting members in monolithic integrated circuit modules prior to the completion of the fabrication of active device components and the subsequent contact and interconnected thereof.

While the invention has been disclosed herein with respect to certain specific embodiments thereof, many modifications and changes will readily occur to those skilled in the art. Accordingly, I intend by the appended claims to cover all such modifications and changes as fall within the true spirit and scope of the present invention.

What I claim as new and desire to secure by Letters Patent of the United States is:

1. The method of forming a monolithic integrated circuit component including an insulated metallic member and comprising the steps of:

a. forming a high-temperature stable insulating film upon one major surface of a semiconductor substrate of one conductivity-type;
b. depositing over said insulating film a film of a metal which is non-reactive with said insulating film at monolithic semiconductor device processing temperatures;
c. treating said metal film by photolithographic and etching techniques to form and retain a pattern of retained metallic film portions;
d. depositing a second insulating film containing opposite-type conductivity activators therein over said patterned metallic film portion and any portion of said first film and said substrate exposed by said photochemical exposure and etching techniques, said first and second insulating films completely encompassing said patterned metallic film portions;
e. heating said body to a temperature and for a time sufficient to diffuse said activators into said semiconductor body in regions not masked by said metallic film portions and cause modification of the conductivity type thereof;
f. masking all but a small portion of said second insulating film by photolithographic techniques;
g. etching said exposed portion of said second insulating film to expose a restricted region of at least one of said patterned metal film portions and a restricted region of said conductivity modified regions of said semiconductor body;
h. contacting said exposed metal film portion and said exposed semiconductor regions each with an electrical contact.

2. The method of claim 1 wherein the semiconductor substrate is silicon, the insulating films comprise materials selected from the group consisting of silicon dioxide, silicon nitride and silicon oxynitride and the metallic conductor is molybdenum.

* * * * *